(12) United States Patent
Yee

(10) Patent No.: US 6,621,484 B1
(45) Date of Patent: Sep. 16, 2003

(54) KEYBOARD KEY DISCRIMINATION BASED ON TIME DIVISION MULTIPLEXING

(75) Inventor: Dawson Yee, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 204 days.

(21) Appl. No.: 09/604,688

(22) Filed: Jun. 27, 2000

(51) Int. Cl.[7] .................................................. G09G 5/00
(52) U.S. Cl. ......................... 345/168; 345/169; 341/26
(58) Field of Search ................................. 345/168, 169; 341/20–26; 400/472, 477, 479, 479.1; 200/5 A, 6 A

(56) References Cited

U.S. PATENT DOCUMENTS

| | | | |
|---|---|---|---|
| 3,786,497 A | | 1/1974 | Davis et al. |
| 3,863,060 A | | 1/1975 | Rode et al. |
| 4,100,606 A | * | 7/1978 | Brantingham ............... 708/142 |
| 4,222,038 A | | 9/1980 | Magerl |
| 4,667,181 A | | 5/1987 | Hastreiter |
| 4,739,310 A | | 4/1988 | Yamamoto |
| 4,857,684 A | | 8/1989 | Gratke |
| 4,876,461 A | | 10/1989 | Gratke |
| 4,920,342 A | | 4/1990 | Gratke |
| 5,349,344 A | | 9/1994 | Head |
| 5,668,544 A | * | 9/1997 | Chang et al. .................. 341/26 |
| 5,748,114 A | | 5/1998 | Koehn |
| 5,805,085 A | * | 9/1998 | Hsu et al. ....................... 341/26 |
| 5,831,556 A | * | 11/1998 | Niot ............................... 341/26 |
| 5,877,709 A | | 3/1999 | Ala-Lehtimäki et al. |
| 6,266,049 B1 | * | 7/2001 | Nakai .......................... 345/168 |
| 6,331,850 B1 | * | 12/2001 | Olodort et al. ............. 345/168 |

* cited by examiner

Primary Examiner—Steven Saras
Assistant Examiner—Amr Awad
(74) Attorney, Agent, or Firm—Banner & Witcoff, Ltd.

(57) ABSTRACT

A keyboard switch matrix arrangement provides keyboard key discrimination utilizing simultaneous groupings of drive line combinations and sense line combinations (time division multiplexing) to discriminate between keyboard keys with substantially fewer total drive and sense lines than a conventional switch matrix, thereby substantially reducing the number of required IC pin connections. The invention permits given sense lines to sense more than one drive line for a valid key press duration (i.e., key actuation), and given drive lines to drive more than one sense line for a given valid key press duration. In this manner, and through utilization of time division multiplexing, the switch capacity of a matrix with a given number of drive lines and sense lines can be substantially increased.

17 Claims, 5 Drawing Sheets

KEYBOARD KEY DISCRIMINATION BASED ON TIME DIVISION MULTIPLEXING

TECHNICAL FIELD

The present invention relates generally to keypad or keyboard data input devices (collectively referred to herein as "keyboards") used with general purpose computers and in a wide variety of application specific electronic devices, e.g., appliances, tools, calculators, etc. The invention has particularly useful application in connection with keyboards, e.g., computer keyboards, employing printed membrane switch structures.

BACKGROUND OF THE INVENTION

To a large extent, the computer industry has settled on using a n×m matrix of sense lines/drive lines for carrying out keyboard key switch discrimination. Such a matrix provides a means for an integrated circuit (IC) micro-controller device to decode (n×m) keyboard keys, with (n+m) electrical interface pins. The micro-controller device sequentially drives a voltage on a plurality of drive lines of the matrix. Keyboard key depression will effect a closure of an associated switch creating an electrical connection between a particular drive line and one of a plurality of sense lines, with the result that the micro-controller device will detect this voltage on the sense line and determine therefrom a corresponding alphanumeric character or function.

Typically, a membrane switch structure is used to form the keyboard key switch matrix. Referring to FIG. 1, a conventional computer keyboard 1 may utilize a conventional membrane switch structure 3, as shown in FIG. 2, which is installed underneath a set of keyboard keys 5. Membrane switch structure 3 generally has three layers 7, 9 and 11. Outer layers 7 and 11 sandwich intermediate layer 9. The three layers are generally made out of a thin insulative sheet of polyester (e.g., Mylar™) or other insulative material. Outer layers 7 and 11 each have, on their respective opposing inside surfaces 13 and 15, switch circuit patterns (17 and 19, respectively) which may be printed (e.g., silk-screened).

Circuit patterns 17 and 19 are appropriately laid out to provide contact points and lines of conduction for each of keyboard keys 5, within a conventional key switch matrix. The circuit patterns may be printed with suitable conductive inks, e.g., a polymer-based conductive ink having silver and/or carbon particles in suspension. Typically, each keyboard key 21 is coupled to a resilient or spring loaded plunger 23 positioned to make contact with a backside of upper outer layer 7 of membrane switch structure 3. Depression of selected ones of keyboard keys 5 causes a corresponding plunger 23 to exert pressure on upper outer layer 7. The resulting pressure causes a portion of electrical circuit 17 (e.g., a sense line) printed on the inner face of layer 7 to come resiliently into electrical contact with a portion of circuit 19 (e.g., a drive line) printed on the inner face of bottom outer membrane layer 11. This contact occurs through contact apertures 24 (one shown) provided in intermediate layer 9. The electrical contact allows passage of a drive signal on a particular sense line for input to an IC micro-controller device. By recognizing the sense line on which the signal is generated, and the timing of the appearance of the generated signal on the sense line, the IC can discriminate which of keyboard keys 5 has been depressed. The micro-controller device, in turn, provides a digital output signal readable by an associated computer.

FIG. 3 schematically illustrates a conventional arrangement of a computer keyboard switch circuit matrix 25 electrically connected with an IC die package 27 (typically mounted within the keyboard housing). In the conventional arrangement, a total of 17 drive lines 29 extend from IC die package 27 to corresponding drive lines 31 of switch circuit matrix 25. Drive lines 31 are laid-out in intersecting relationship with a total of eight sense lines 33. As previously described, and shown in FIG. 2, the drive lines are typically arranged on a first outer layer of a membrane switch structure, and the sense lines are typically arranged on a second outer layer of a membrane switch structure. This conventional arrangement requires IC die package 27 to accommodate a total of twenty-five (8+17=25) pin connections 35 spaced about the periphery of die package 27, for the signal (drive and sense) lines alone. Additional pin connections (not shown) must also be provided, e.g., for $V_{cc}$, Gnd, Osc, HostData and HostClk.

A silicon chip 37 centrally located within die package 27 contains IC logic (including the micro-controller device) for carrying out keyboard key discrimination and related functions. The logic circuitry integrated onto chip 37 is small relative to the available surface area of chip 37 and the high levels of integration attainable with available photolithographic IC fabrication techniques. A much smaller chip (and hence less silicon) could be utilized if it were not for the fact that a certain minimum size of chip 37 is required in order to accommodate pin connections 39 about the periphery of chip 37. Also, the area of chip 37 is small relative to the overall size of die package 27, due to the relatively large space requirements for making the pin connections 35 on the outer periphery of die package 27, as well as pin connections 39 located around the periphery of chip 37. But for the space required to accommodate the large number of required pin connections, the size of die package 27 could be reduced considerably, thus reducing the printed circuit board space required within the keyboard for accommodating die package 27. In addition, a reduction in the number of pin connections would reduce the materials, and manufacturing costs associated with making, as well as testing, the pin connections.

SUMMARY OF THE INVENTION

In a first aspect, the invention provides a keyboard switch matrix for use in keyboard key discrimination. The matrix includes a plurality of drive lines and a plurality of sense lines. A plurality of switches are provided for selectively causing contact between the drive lines and sense lines upon actuation of associated keyboard keys. At least one of the switches is arranged to bring into contact, upon actuation of an associated key, at least one of a combination of plural drive lines with a sense line; and a combination of plural sense lines with a drive line.

In a second related aspect, the invention provides an integrated circuit (IC) including a switch matrix and logic circuitry for sequentially driving signals, in timed relationship with each other, on a plurality of drive lines in a cyclical manner. The IC senses signals that appear on one or more of a plurality of sense lines as a result of at least one of a combination of plural drive lines contacting the one or more sense lines, and a combination of plural sense lines contacting the one or more drive lines. An actuated key is discriminated based on a time relationship of the driving of signals and a sensing of the signals appearing on the one or more sense lines.

In a third aspect, the invention is embodied in a method for keyboard key discrimination by time division multiplexing. Signals are sequentially driven in timed relationship with each other on a plurality of drive lines in a cyclical manner. Signals appear on one or more sense lines as a result of at least one of a combination of plural drive lines contacting the one or more sense lines and plural sense lines contacting one or more of the drive lines. These signals are sensed, and an actuated key is discriminated from among a plurality of keys, based upon a time relationship of the driving of signals and a sensing of the signals appearing on the one or more sense lines.

In accordance with the invention, keyboard key discrimination by time division multiplexing may be used to reduce the size of an integrated circuit (IC), and the overall size of an IC die package, by reducing the total number of pins required to interface with a keyboard key switch matrix. The invention provides an arrangement whereby a given sense line can sense signals of more than one drive line for a valid key press duration (i.e., key actuation), and whereby a given drive line can drive more than one sense line for a given valid key press duration. In contrast with conventional methods, which use one-to-one correspondence between keyboard key and drive/sense line pairs, the present invention utilizes plural drive/sense line combinations to discriminate among keyboard keys in a time division multiplexed fashion. In this manner, the present invention reduces the number of drive and sense lines required for key discrimination, thereby substantially reducing the total number of IC pin connections required for a typical keyboard having, e.g., 131 keys.

The above and other features and advantages of the present invention will be readily apparent and fully understood from the following detailed description of preferred embodiments, taken in connection with the appended drawings.

DETAILED DESCRIPTION OF THE INVENTION

Figure 4:
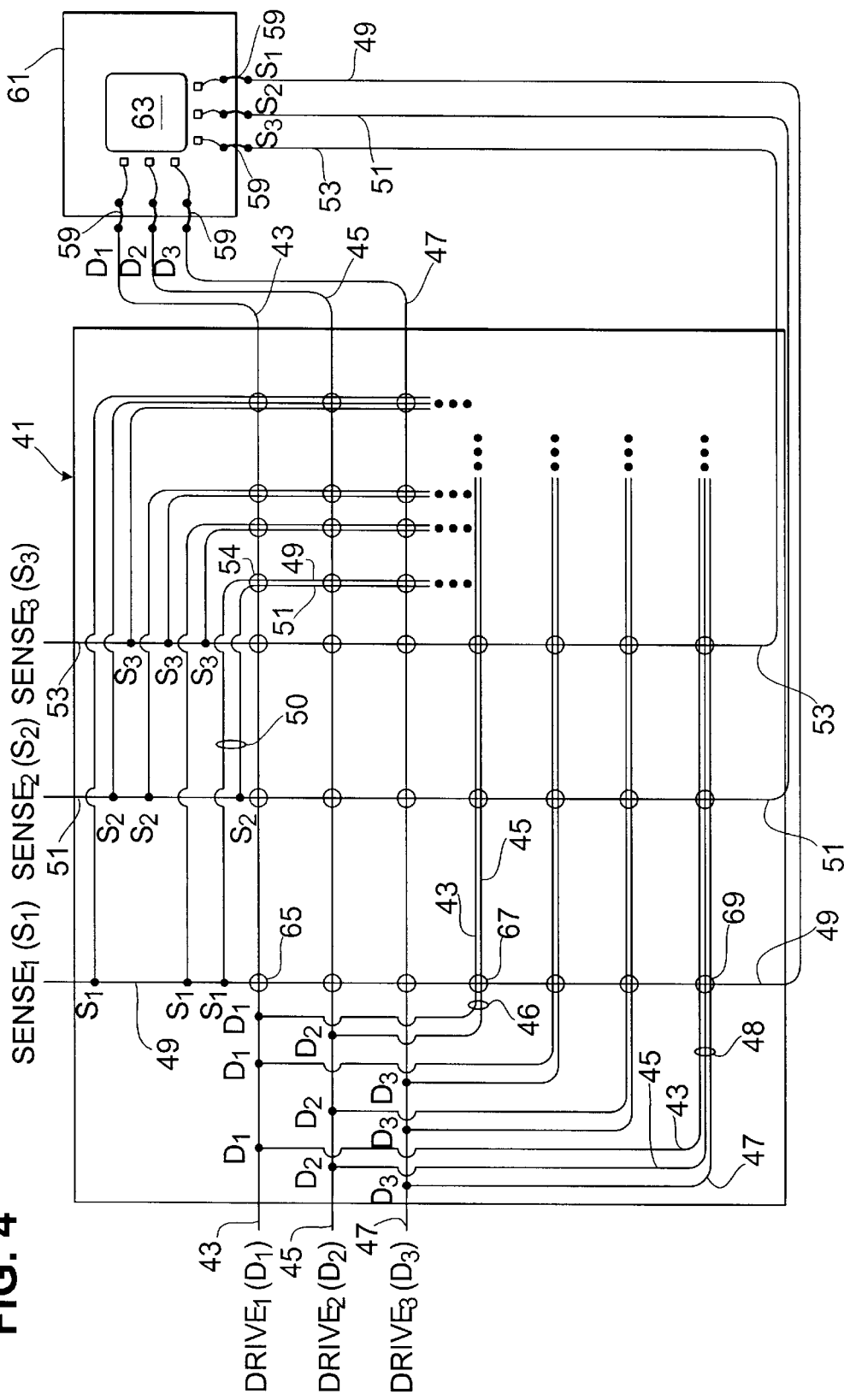
FIG. 4 is a schematic depiction of a keyboard key discrimination system based on time division multiplexing in accordance with the present invention.

Referring to FIG. 4, a keyboard key discrimination system in accordance with the present invention is shown. For ease of illustration and discussion, exemplary switch matrix arrangement 41 has three (3) drive lines 43, 45, 47 and three (3) sense lines 49, 51, 53. It will be recognized that more or less drive lines and sense lines may be arranged in accordance with the present invention, for discrimination of more or less keyboard keys. Drive lines 43, 45, 47 are laid-out in intersecting relationship with sense lines 49, 51, 53. In accordance with the invention, single drive/sense lines intersect single sense/drive lines. In addition, combinations of plural drive lines intersect sense lines and combinations of plural sense lines intersect drive lines. For example, in combination of plural drive lines 46, branch lines off of drive lines 43 (Drive$_1$) and 45 (Drive$_2$) are laid out to intersect sense line 49 (Sense$_1$) at switch point 67. As another example, in combination of plural drive lines 48, branch lines off of drive lines 43 (Drive$_1$), 45 (Drive$_2$), 47 (Drive$_3$ are laid out to intersect sense lines 49, 51, 53, and in particular, sense line 49, at switch point 69. As further shown, in a combination of plural sense lines 50, branch lines off of sense line 49 (Sense$_1$) and sense line 51 (Sense$_2$) are laid out to intersect drive line 43 at switch point 54. In the illustrated exemplary arrangement, drive lines 43, 45, 47 and sense lines 49, 51, 53, extend from switch matrix 41 to IC die package 61. The drive lines 43, 45, 47 and sense lines 49, 51, 53 are connected to a IC micro-controller 63 by way of six (6) pins 59. Additional pin connections (not shown) would typically also be provided, e.g., for V$_{cc}$, Gnd, Osc, HostData and HostClk.

Figure 1:
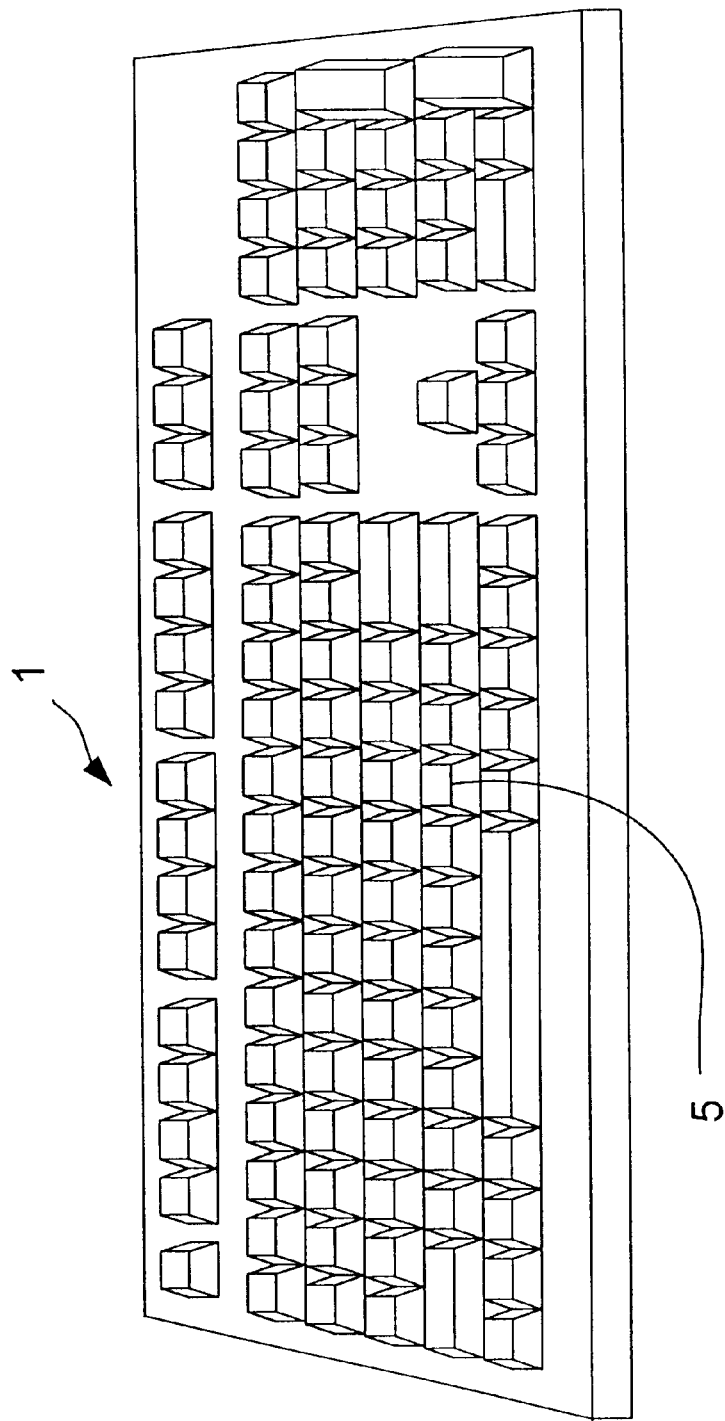
FIG. 1 is a perspective view of a conventional computer keyboard.
Figure 2:
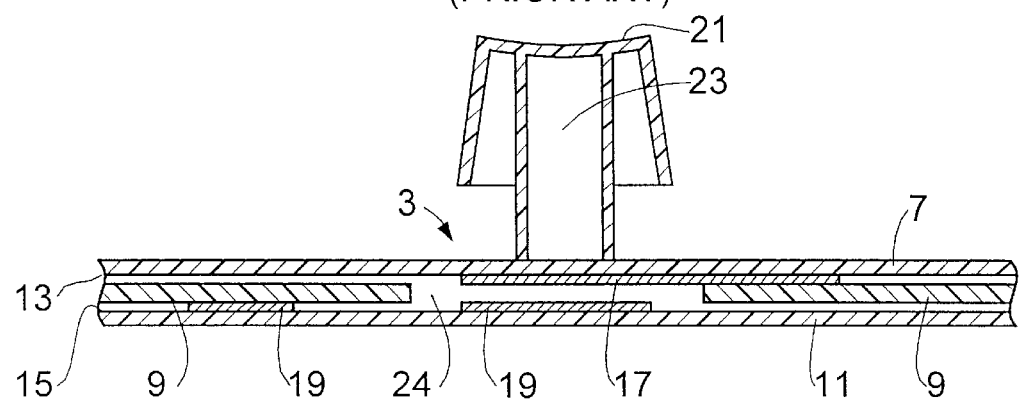
FIG. 2 is a cross-sectional view of a conventional three layer membrane switch structure, and associated keyboard key.
Figure 3:
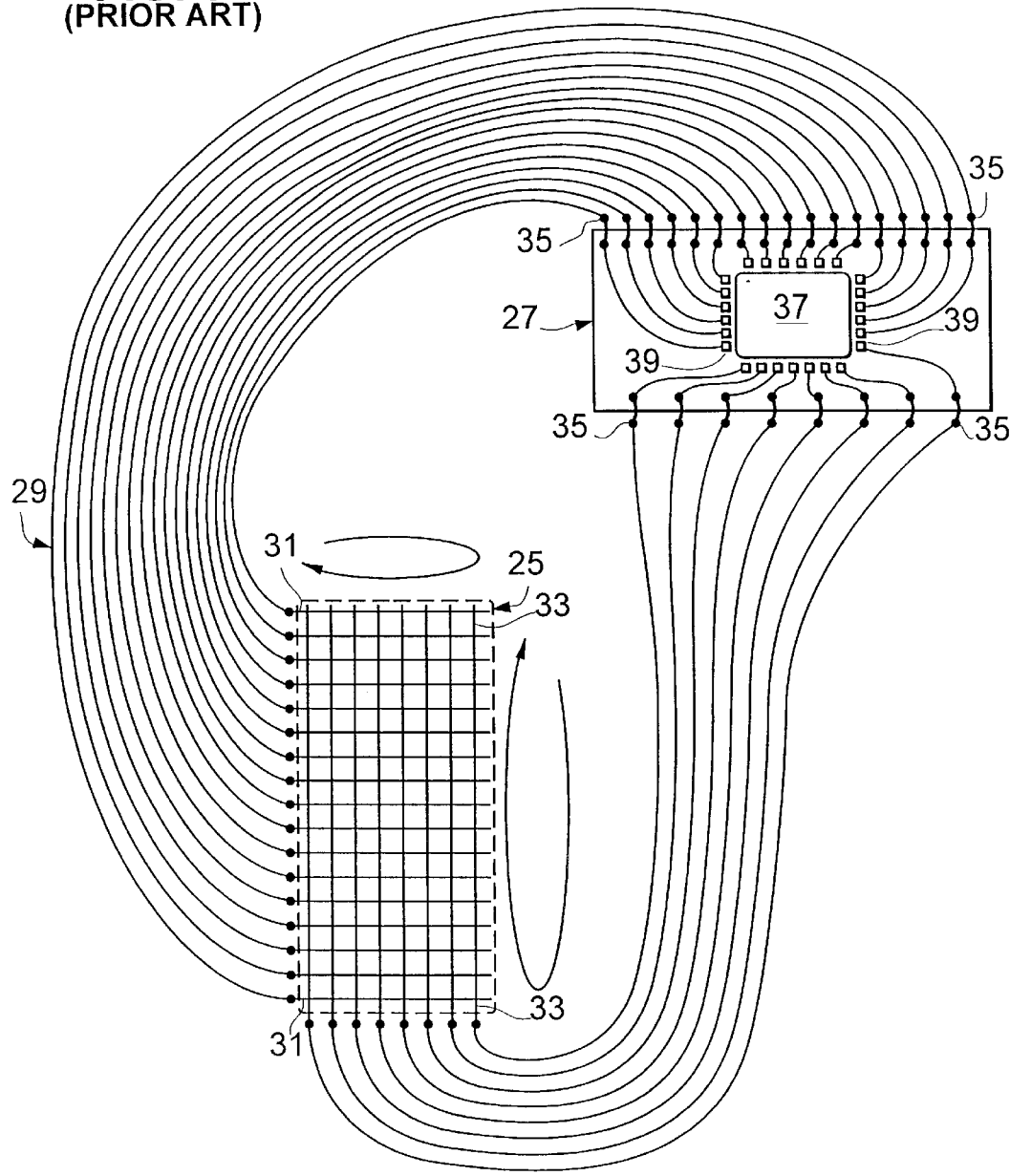
FIG. 3 is a schematic depiction of a conventional arrangement of a keyboard key switch circuit matrix in electrical connection with an IC die package.

In a preferred embodiment, switch matrix arrangement 41 is formed on a membrane switch structure 3 of the general type shown in FIG. 2. Advantageously, the switch structure 41 may be formed using known techniques and printed with suitable conductive inks, e.g., a polymer-based conductive ink having silver and/or carbon particles in suspension. The plurality of drive lines 43, 45, 47, including drive line combinations, e.g., 46, 48 may be printed on the inside surface 13 of outer layer 7 of the membrane switch structure 3. The plurality of sense lines 49, 51, 53, including, e.g., sense line combinations, e.g., 50 may be printed on the inside surface 15 of outer layer 11 of the membrane switch structure 3.

As embodied in a membrane switch structure of the general type shown in FIG. 2, switch points (i.e., key switches) 54, 65, 67, 69 are formed at contact apertures 24 (one shown) provided in intermediate layer 9. Each of the switch points 54, 65, 67, 69 has an associated keyboard key 21 coupled to a resilient or spring loaded plunger 23 positioned to make contact with a backside of upper outer layer 7 of membrane switch structure 3. Depression of the associated keyboard key 21 causes the corresponding plunger 23 to exert pressure on the upper outer layer 7. The resulting pressure causes, e.g., combination of plural drive lines 48 to come resiliently into electrical contact with, e.g., sense line 49, at switch point 69. Functionally, switch points 54, 65, 67, 69 act as normally "open" switches that prevent electrical contact between drive/sense lines. Upon the actuation of an associated key 21, a corresponding switch "closes" (i.e., makes electrical contact between drive/sense lines).

In accordance with the invention, IC micro-controller 63 sequentially drives signals in a cyclical manner, in timed relationship with each other, on drive lines 43 (Drive$_1$), 45 (Drive$_2$, 47 (Drive$_3$. The present invention extends the ordinary switch capacity of a conventional matrix by making use of time division multiplexing drive signals from the IC micro-controller device 63. Drive signals are typically DC voltage signals that are pulsed in a known timed fashion. It is recognized that the voltage and logic of the signals can be reversed so that the sense lines are pulled-up with resistors, and drive lines are driven active low with open collector drivers.

Figure 5:
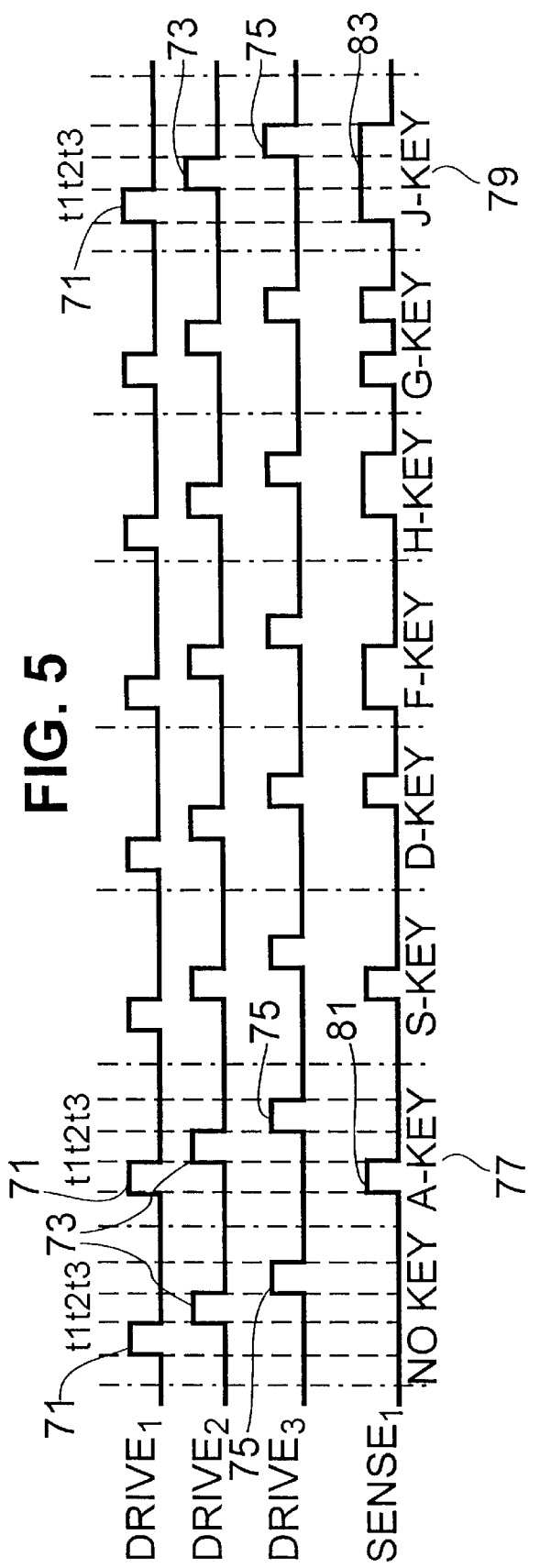
FIG. 5 is a timing diagram illustrating timing relationships between exemplary signals on drive and sense lines in accordance with the present invention.

The exemplary timing diagram of FIG. 5 illustrates timing relationships between a plurality of drive signals (e.g., Drive$_1$, Drive$_2$, Drive$_3$) and a single sense signal (e.g., Sense 1), as applicable to key discrimination in accordance with the present invention. The three drive lines Drive$_1$, Drive$_2$, Drive$_3$ are sequentially driven active high, as shown, by drive signals 71 on Drive$_1$, 73 on Drive$_2$, 75 on Drive$_3$, and then tri-stated (i.e., cycled). Each signal pulse 71, 72, 73 is assigned a specific time slot, for example, $t_1$, $t_2$ and $t_3$, respectively, and this timing relationship is constantly maintained by a timing source. As the drive lines $Drive_1$, $Drive_2$, $Drive_3$ are sequentially driven, IC micro-controller 63 monitors sense line $Sense_1$ for detection of the drive signals in the specific time slot to which they are assigned (e.g., $t_1$, $t_2$, $t_3$). The IC micro-controller 63 monitors the sense lines 49, 51, 53 for a closure of an associated one of the switches, e.g., 54, 65, 67, 69 (actuated by a corresponding keyboard key depression) that results in passage of the drive signals onto, e.g., a particular sense line, or a combination of sense lines, for input to IC micro-controller device 63. IC micro-controller device 63 circuitry recognizes the timing relationship of the signals on the drive lines, and the timing of the appearance of the generated signal on a sense line or a combination of plural sense lines. IC 63 can thereby discriminate which of keyboard keys 5 has been depressed. The micro-controller device, in turn, provides a digital output signal readable by an associated computer. Thus, by time division multiplexing the drive signals, the present invention enables a given sense line to sense more than one drive line for a given valid key actuation. Additionally, the present invention also extends to multiplexing of the sense lines, where a given drive line can drive more than one sense line for a given valid key actuation. Thus, more than one sense line having a valid signal can be used to decode keyboard keys.

Referring again to FIG. 5, when "NO KEY" is actuated, drive lines $Drive_1$, $Drive_2$, $Drive_3$ each have their respective signals $t_1$, $t_2$, $t_3$, but no corresponding signal appears on $Sense_1$. Since no key has been actuated, all of the switches (e.g., 65, 67, 69 on $Sense_1$) remain open and no signal will be sensed on the sense line 49 by IC micro-controller 63.

If, e.g., "A-KEY" 77 associated with, e.g., switch 65 of switch matrix 41 is actuated, then switch 65 will go from an "open" to a "closed" state. Accordingly, drive line 43 will make electrical contact with sense line 49 at switch point 65. Drive signal 71 on $Drive_1$ in time slot ti will appear on sense line $Sense_1$ in time slot $t_1$ as sensed signal 81, as shown in FIG. 5. Upon closure of switch 65, IC micro-controller 63 will sense the drive signal 71 on $Sense_1$ in time slot $t_1$. The IC micro-controller 63 switch circuitry recognizes the unique situation where drive signal 71 appears on the sense line $Sense_1$ in slot $t_1$ and based on this information, is able to discriminate that the "A-KEY" 77 was actuated.

In another example, e.g., "J-KEY" 79 associated with, e.g., switch 69 of switch matrix 41 is actuated, then switch 69 will go from an "open" to a "closed" state. Accordingly, in this example, drive lines 43, 45, 47 (i.e., combination of plural drive lines 48) will make contact with sense line 49 at switch point 69. Drive signal $Drive_1$ will appear on sense line $Sense_1$ in time slot $t_1$, drive signal $Drive_2$ will appear on sense line $Sense_1$ in time slot $t_2$, and drive signal $Drive_3$ will appear on sense line $Sense_1$ in time slot $t_3$ (i.e., collectively as sensed signal 83), as shown in FIG. 5. Upon closure of switch 69, IC micro-controller 63 will sense the drive signals $Drive_1$ 71, $Drive_2$ 73, $Drive_3$ 75 as sense signal 83 on $Sense_1$ in time slots $t_1$, $t_2$, $t_3$, respectively. The IC micro-controller 63 switch circuitry recognizes the unique situation where drive signals $Drive_1$ 71, $Drive_2$ 73, $Drive_3$ 75 appear on the sense line $Sense_1$ in slots $t_1$, $t_2$, $t_3$ and based on this information, is able to determine that the "J-KEY" 79 was actuated. Once the IC micro-controller 63, discriminates among the plurality of keys and determines which key was actuated, the IC micro-controller 63 in turn, provides a digital output signal, representing the actuated key, readable by an associated computer.

As illustrated in switch matrix arrangement 41 and described above, each intersection of a drive line with a sense line, a combination of plural drive lines with a sense line, a combination of plural sense lines with a drive line, or a combination of plural drive lines with a combination of plural sense lines, represents a discrete and identifiable switch that may be used to represent, for example, an associated computer keyboard key or other type of input device such as used, e.g., in calculators, telephones touch pads, touch screen displays, etc. By using different combinations of the 3 drive lines 43, 45, 47 and sense lines 49, 51, 53 (a total of six IC pin connections 59), as many as forty-nine (49) separate keys can be discriminated. On the other hand, with the conventional one-to-one correspondence of keyboard switches and drive line/sense line pairs, a matrix of three drive lines and three sense lines would permit discrimination between a total of only nine (3×3) switches (Keys 1–9). Thus, the present invention, by time division multiplexing, provides key discrimination for a given number of keys with substantially fewer total drive lines and sense lines, thereby substantially reducing the number of required IC pin connections.

The maximum number of keys that may be represented by a given number of drive lines and sense lines may be calculated with the following mathematical formula:

$$(2^n-1) \times (2^m-1)$$

where "n" represents the number of drive lines and "m" represents the number of sense lines. Applying this formula to exemplary switch matrix 41 having 3 drive lines 43, 45, 47 and 3 sense lines 49, 51, 53, where "n"=3 and "m"=3 yields: $(2^3-1) \times (2^3-1) = 49$ (number of keys that can be discriminated in accordance with the present invention, with 3 drive lines and 3 sense lines). The following table illustrates the various possible combinations of 3 drive lines and 3 sense lines that may be used to discriminate among a total of 49 keyboard keys.

|  | Sense1 | Sense2 | Sense3 | Sense1 + Sense2 | Sense1 + Sense3 | Sense2 + Sense3 | Sense 1 + Sense2 + Sense3 |
| --- | --- | --- | --- | --- | --- | --- | --- |
| Drive1 | Key1 | Key2 | Key3 | Key22 | Key29 | Key36 | Key43 |
| Drive2 | Key4 | Key5 | Key6 | Key23 | Key30 | Key37 | Key44 |
| Drive3 | Key7 | Key8 | Key9 | Key24 | Key31 | Key38 | Key45 |
| Drive1 + Drive2 | Key10 | Key11 | Key12 | Key25 | Key32 | Key39 | Key46 |
| Drive1 + Drive3 | Key13 | Key14 | Key15 | Key26 | Key33 | Key40 | Key47 |
| Drive2 + Drive3 | Key16 | Key17 | Key18 | Key27 | Key34 | Key41 | Key48 |
| Drive1 + Drive2 + Drive3 | Key19 | Key20 | Key21 | Key28 | Key35 | Key42 | Key49 |

To discriminate among additional keys, the number of drive lines and/or sense lines can be increased. Thus, as another example, increasing the number of drive lines to four (i.e., "n"=4) and increasing the number of sense lines to four (i.e., "m"=4) yields as many as 225 different keys that may be discriminated, applying the above formula. In this case, in accordance with the present invention, a total number of 8 (4 for the drive lines and 4 for the sense lines) IC interface pins will be required to discriminate between as many as 225 keyboard keys. This is considerably less than a conventional 8×17 matrix that requires 25 (8+17) IC interface pins to discriminate between only 136 keys.

Methods that can be implemented to avoid discerning incorrect keys where multiple keys are simultaneously depressed are now described.

One approach is to restrict the physical layout of the keys via grouping, in order to lessen the likelihood of simultaneous key presses within a key grouping. In a conventional keyboard layout example, the "F", "G", "T","B","V" keys may be grouped together on one sense line. Given that the left index finger is used for depressing these keys, it is very unlikely that these keys would be depressed simultaneously by a touch typist. Another example would be to group the "S","W","X" keys on a common sense line. Since the left ring finger is used for depressing these keys, it is unlikely that two keys within the group would be simultaneously pressed.

Another method of avoiding incorrect key detection due to simultaneous key depression is to electronically time the duration of key depresses. A "long term" depress (e.g. 120 wpm=10 characters/second=100 ms/char, ~50 msec or longer key depress . . . exact value depends on mechanical properties of the design) may be considered a real (intended) key press, whereas a "transitory" key depress (less than ~50 msec) would be ignored as inadvertent. It is also possible to further discern a "long term" versus "transitory" key depress via a duty cycle, that is, by determining, on average how long a real key depresses is versus a transitory key depress (subject to some predetermined time limits e.g. ~50 msec).

A further method entails observing the sequence and timing of key presses and determining the intended key presses based on the key groupings, timings, relative press timings, and press sequences. Some keys (e.g. "caps lock", "num lock","scr lock","tab") are not likely to be depressed with other keys and are not affected by this concern. Other keys (e.g. "shift","enter","caps","ctrl") are expected to be depressed with other keys and can be addressed by assigning these keys to switches within a traditional n×m matrix.

The present invention has been described in terms of preferred and exemplary embodiments thereof. Numerous other embodiments, modifications and variations within the scope and spirit of the appended claims will occur to persons of ordinary skill in the art from a review of this disclosure.

What is claimed is:

1. A keyboard switch matrix for use in keyboard key discrimination, comprising:

a plurality of drive lines;

a plurality of sense lines; and a plurality of switches for selectively causing contact between the drive lines and sense lines upon actuation of associated keyboard keys, wherein at least one of the switches is arranged to bring into contact, upon actuation of an associated key:

a combination of plural drive lines with a sense line; or a combination of plural sense lines with a drive line;

whereby, upon sequentially driving signals in timed relationship with each other on said plurality of drive lines in a cyclical manner, and sensing said signals that appear on one or more of said plurality of sense lines as a result of a combination of plural drive lines contacting said one or more of said plurality of sense lines, or a combination of plural sense lines contacting one or more of said plurality of drive lines, an actuated key can be discriminated from among a plurality of keys, based upon a time relationship of said driving of signals and a sensing of said signal appearing on the one or more sense lines.

2. The keyboard switch matrix of claim 1, wherein a first switch is arranged to bring into contact a combination of plural drive lines with a sense line.

3. The keyboard switch matrix of claim 2, wherein a second switch is arranged to bring into contact a combination of plural sense lines with a drive line.

4. The keyboard switch matrix of claim 3, wherein a third switch is arranged to bring into contact a combination of three sense lines with a drive line.

5. The keyboard switch matrix of claim 2, wherein a second switch is arranged to bring into contact a combination of three drive lines with a sense line.

6. The keyboard switch matrix of claim 5, wherein a third switch is arranged to bring into contact a combination of plural sense lines with a drive line.

7. The keyboard switch matrix of claim 6, wherein said third switch is arranged to bring into contact a combination of three sense lines with a drive line.

8. The keyboard switch matrix of claim 1, wherein a first switch is arranged to bring into contact a combination of plural sense lines with a drive line.

9. The keyboard switch matrix of claim 8, wherein a second switch is arranged to bring into contact a combination of three sense lines with a drive line.

10. The keyboard switch matrix of claim 1, wherein a first switch is arranged to bring into contact a combination of at least three sense lines with at least three drive lines.

11. The keyboard switch matrix of claim 1, wherein the number of switches equals or is less than $(2^n-1) \times (2_m-1)$, wherein n is the number of drive lines and m is the number of sense lines.

12. The keyboard switch matrix of claim 11, wherein the plurality of drive lines comprises three drive lines.

13. The keyboard switch matrix of claim 12, wherein the plurality of sense lines comprises three sense lines.

14. The keyboard switch matrix of claim 11, wherein the plurality of sense lines comprises three sense lines.

15. The keyboard switch matrix of claim 1, wherein the keyboard switch matrix comprises a membrane switch structure, said plurality of drive lines being printed on a first layer of the membrane switch structure, and the plurality of sense lines being printed on a second layer of the membrane switch structure.

16. A keyboard switch circuit for providing key discrimination among a plurality of keyboard keys, the switch circuit comprising a switch matrix comprising a plurality of drive lines, a plurality of sense lines and a plurality of switches for selectively causing contact between the drive lines and sense lines upon actuation of associated keyboard keys, wherein at least one of the switches is arranged to bring into contact, upon actuation of an associated key, a combination of plural drive lines with a sense line or a combination of plural sense lines with a drive line; and an integrated circuit (IC) coupled to the plurality of drive lines and sense lines, the IC comprising logic circuitry for:

sequentially driving signals in timed relationship with each other on said plurality of drive lines in a cyclical manner, and sensing said signals that appear on one or more of said plurality of sense lines as a result of at least one of a combination of plural drive lines contacting said one or more sense lines and a combination of plural sense lines contacting one or more drive lines; and discriminating an actuated key based on a time relationship of said driving of signals and a sensing of said signals appearing on said one or more sense lines.

17. A method for keyboard key discrimination by time division multiplexing, the method comprising the steps of:

sequentially driving signals in timed relationship with each other on a plurality of drive lines in a cyclical manner;

sensing said signals that appear on one or more sense lines as a result of a combination of plural drive lines contacting said one or more sense lines, or a combination of plural sense lines contacting one or more of said drive lines; and discriminating an actuated key from among a plurality of keys, based upon a time relationship of said driving of signals and a sensing of said signals appearing on the one or more sense lines.

* * * * *

UNITED STATES PATENT AND TRADEMARK OFFICE
CERTIFICATE OF CORRECTION

PATENT NO. : 6,621,484 B1
DATED : September 16, 2003
INVENTOR(S) : Dawson Yee

It is certified that error appears in the above-identified patent and that said Letters Patent is hereby corrected as shown below:

Column 8,
Line 43, please replace "$(2_m-1)$" with -- $(2^m-1)$ --.

Signed and Sealed this

Twenty-second Day of June, 2004

JON W. DUDAS
*Acting Director of the United States Patent and Trademark Office*